(12) United States Patent
Dotsenko (10) Patent No.: US 8,937,255 B1
(45) Date of Patent: Jan. 20, 2015

(54) SUPERCONDUCTIVE MULTI-CHIP MODULE FOR HIGH SPEED DIGITAL CIRCUITS

(75) Inventor: Vladimir V. Dotsenko, Mahopac, NY (US)

(73) Assignee: Hypres Inc., Elmsford, NY (US)

( * ) Notice: Subject to any disclaimer, the term of this patent is extended or adjusted under 35 U.S.C. 154(b) by 268 days.

(21) Appl. No.: 13/243,016

(22) Filed: Sep. 23, 2011

Related U.S. Application Data (62) Division of application No. 11/840,931, filed on Aug. 18, 2007, now Pat. No. 8,159,825.

(60) Provisional application No. 60/840,379, filed on Aug. 25, 2006.

(51) Int. Cl.
*H05K 1/16* (2006.01)

(52) U.S. Cl.
USPC ........... 174/260; 174/259; 174/261; 174/262; 174/263; 174/254; 361/760; 361/761; 361/762; 361/763; 361/764; 257/686; 257/772; 257/777; 257/778; 257/779

(58) Field of Classification Search
USPC .............. 174/125.1, 259, 260, 254, 261, 262, 174/263; 361/760, 772, 761, 768, 773; 257/686, 777, 778, 779, 780, 783
See application file for complete search history.

(56) References Cited

U.S. PATENT DOCUMENTS

| | | | | |
|---|---|---|---|---|
| 4,749,120 | A * | 6/1988 | Hatada | 228/123.1 |
| 4,893,171 | A * | 1/1990 | Denda | 257/783 |
| 4,943,792 | A * | 7/1990 | Srivastava et al. | 335/216 |
| 6,121,689 | A * | 9/2000 | Capote et al. | 257/783 |
| 6,420,895 | B1 * | 7/2002 | Herr et al. | 326/3 |
| 6,646,350 | B2 * | 11/2003 | Tanaka et al. | 257/759 |
| 7,953,174 | B2 | 5/2011 | Asbeck et al. | |
| 8,159,825 | B1 * | 4/2012 | Dotsenko | 361/760 |
| 2003/0116347 | A1 * | 6/2003 | Kubo et al. | 174/260 |
| 2003/0183951 | A1 * | 10/2003 | Achari et al. | 257/787 |
| 2005/0014313 | A1 * | 1/2005 | Workman et al. | 438/127 |
| 2005/0277231 | A1 * | 12/2005 | Hembree et al. | 438/127 |

\* cited by examiner

*Primary Examiner* — Timothy Thompson
*Assistant Examiner* — Paresh Paghadal
(74) *Attorney, Agent, or Firm* — Steven M. Hoffberg; Ostrolenk Faber LLP (57) ABSTRACT

A method for electrically interconnecting two substrates, each having a corresponding set of preformed electrical contacts, the substrates comprising an electronic circuit, and the resulting module, is provided. A liquid curable adhesive is provided over the set of contacts of a first substrate, and the set of electrical contacts of the second substrate is aligned with the set of electrical contacts of the first substrate. The sets of electrical contacts of the first and second substrate are compressed to displace the liquid curable adhesive from the inter-contact region, and provide electrical communication between the respective sets of electrical contacts. The liquid curable adhesive is then cured to form a solid matrix which maintains a relative compression between the respective sets of electrical contacts. One embodiment of the module comprises a high-speed superconducting circuit which operates at cryogenic temperatures.

22 Claims, 4 Drawing Sheets

MCM = Multi-Chip Module
SIS* = Superconductor/Insulator/Superconductor (not required for some applications
SQUID = Superconducting Quantum Interference Device

US 8,937,255 B1

SUPERCONDUCTIVE MULTI-CHIP MODULE FOR HIGH SPEED DIGITAL CIRCUITS

RELATED APPLICATIONS

The present application claims benefit of priority from U.S. Provisional Patent Application No. 60/840,379, filed Aug. 25, 2006, and is a Division of U.S. patent application Ser. No. 11/840,931, filed Aug. 18, 2007, the entirety of which are expressly incorporated herein by reference.

STATEMENT OF GOVERNMENT RIGHTS

The invention was produced under U.S. Army CERDEC SBIR Contract W15P7T-04-C-K605, and the government has certain rights herein. The invention described herein may be manufactured, used, imported, sold, and licensed by or for the Government of the United States of America without the payment of any royalty thereon or therefor.

FIELD OF THE INVENTION

The present invention relates to the field of multichip modules, and methods for production thereof.

BACKGROUND OF THE INVENTION

Multichip modules provide a plurality of functional wafers which are supported and interconnected on a single substrate, and thereafter the module may be connected to other components as an integral unit.

As compared to integrated circuits, the multichip module provides opportunity for use of various incompatible technologies (i.e., those that cannot be fabricated together) within a single system component, and the use of relatively simpler components and lower spatial density than required within an integrated circuit to obtain the same functionality. However, by eliminating separate packaging for the components, certain costs can be reduced, density increased, and performance increased with respect to discrete packaged or wire-bonded components on a circuit board.

In normal semiconductor technology circuits, operation leads to significant heat dissipation, and when such components are supported in a multichip module, potentially significant amounts of heat must be removed through the module substrate and packaging. Therefore, the interface between the functional wafer and substrate for such modules should have a low thermal impedance (high thermal conductivity). For example, a low melting temperature alloy may be used to both electrically and mechanically bond the wafer to the substrate through a set of "solder bumps". This process typically requires heating the substrate and wafer above the reflow temperature of the solder, and thus may damage certain temperature-sensitive electronics. Because of thermal cycling issues, the wafer and substrate should have matching thermal coefficients of expansion. Typically, there is no filler material between the wafer and substrate prior to reflow, since this could impair the reflow process or cause other problems. A filler may be added in the space between the wafer and substrate after reflow, for example to enhance thermal conductivity.

Superconducting circuits based on Rapid-Single-Flux-Quantum logic are the fastest in any electronic technology, with clock speeds in excess of 20 GHz routinely achieved, and speeds in excess of 100 GHz projected as the devices are scaled to smaller sizes. In the preferred embodiment of these integrated circuits, they are composed of thousands of Josephson junctions, each constructed from two layers of superconducting niobium with an intervening oxide layer about 1 nanometer thick. To function properly, these circuits must be cooled to cryogenic temperatures below the critical temperature of 9K (−264 C). Further, the very thin oxide layer of the circuits can be damaged by temperatures in excess of about +200 C, so elevated temperatures in fabrication and processing must be avoided. This is a low-power, low-voltage, low-impedance technology, based on the propagation of voltage pulses less than 1 mV high and 1 picosecond wide, with device resistances of a few ohms. As the technology has developed, it has become necessary to develop multi-chip modules (MCM), where these fast voltage pulses pass between superconducting chips on a superconducting carrier. To be practical, such an MCM must be both robust and reliable for all high-speed links in the package.

Superconducting circuits as currently implemented typically have a lower functional density than their more evolved silicon semiconductor counterparts, and therefore achieving complex functionality may require multiple wafers. Superconducting circuits dissipate small amounts of power, and therefore the function of the substrate is principally to provide mechanical support and electrical pathways, and far less to provide effective dissipation of operating power. During cooldown to cryogenic temperatures, the MCM is typically mounted in a vacuum, and therefore the thermal path for cooling is generally through the supporting substrate.

A standard technique for superconducting MCMs has been developed in the prior art, based on indium-tin solder reflow. The In—Sn alloy was chosen since it melts at a very low temperature, less than 200 C. First, a superconducting chip with gold contacts is dipped in a bath of molten solder, and In—Sn droplets attach to the gold contacts and cool to form solid bumps. The chip is then carefully aligned so that these solder bumps are directly above corresponding gold contacts in the chip carrier. Then, the assembly is carefully heated to remelt the solder bumps, which then flow to wet the gold contacts on the carrier ("solder reflow"). The assembly is then clamped and cooled down to room temperature. The resulting MCM is then mounted in a cryogenic package and cooled to below 9K for high-speed testing. Devices made in this way have demonstrated transmission of high-speed pulses up to about 100 GHz. K. E. Yokoyama, G. Akerling, A. D. Smith, and M. Wire, "Robust Superconducting Die Attach Process", IEEE Trans. Applied Supercond., VOL. 7, NO. 2 (June 1997), pp. 2631-2634, describes In—Sn reflow (<140 C) solder bonds for superconducting MCMs using flip chip technology, i.e., a controlled collapse micro-solder reflow technique. See also, U.S. Pat. No. 5,920,464, (Reworkable microelectronic multi-chip module, Yokoyama); U.S. Pat. No. 6,032,852 (Reworkable microelectronic multi-chip module, Yokoyama), U.S. Pat. No. 6,050,476 (Reworkable microelectronic multi-chip module, Yokoyama), U.S. Pat. No. 6,216,941 (Method for forming high frequency connections to high temperature superconducting circuits, Yokoyama), each of which is expressly incorporated herein by reference. However, the existing techniques for die attachment for superconducting MCMs, including Yokoyama et al., are not adequate for the demanding ambient conditions these systems must endure. For example, modules constructed using the reflow technique according to Yokoyama et al. tend to fail under vibration, and especially ultrasonic vibration. The reliability of the bond achieved by the In—Sn solder-reflow method is very weak, with poor adhesion, and the contacts break easily with thermal cycling and handling. Furthermore, the necessary wetting during the reflow process becomes less reliable as the contact area decreases, particularly for sizes of 50 microns or less. This is unacceptable for packaging of chips with many small contacts.

When using superconducting electronics, the ability to support high data rate communications, both within a wafer, and between wafers, is critical. For example, a target specification is to provide clock and data links between receiver front ends and subsequent digital signal processing circuits at rates above 40 Gbps. Such systems find application in high bandwidth communications systems and processing circuits, which may require location in the field using a cryocooler, where environmental stresses are apparent. Thus, an improved multichip module fabrication technique with improved vibrational tolerance is desired.

Differential thermal expansion is well known to create problems in stressing glued connections. See, Hsieh (U.S. Pat. No. 6,605,491), expressly incorporated herein by reference, which discusses bonding a silicon chip to a polymeric substrate, and in particular thermal stress issues over a range of −55 C and +125 C, using adhesives generally having a high viscosity. Such thermal stress can cause bowing in flexible substrates, and flaking or cracking of the adhesive in rigid substrates. See also, U.S. Pat. No. 6,919,642. These problems would be much worse for temperature variations from above room temperature to near absolute zero, a range of over 300K. It is also well known that many materials (especially most polymers) become weak and brittle at cryogenic temperatures.

U.S. App. 20040214377 and EP 1,473,769 entitled "Low thermal expansion adhesives and encapsulants for cryogenic and high power density electronic and photonic device assembly and packaging", expressly incorporated herein by reference, adhesives, with a high viscosity, for bonding electronic device in which small particles with a negative coefficient of thermal expansion (CTE) are added to produce a filled adhesive with small net CTE to match the wafers to be bonded, in order to prevent delamination due to stress at cryogenic temperatures.

SUMMARY OF THE INVENTION

The present invention provides a multichip module, and method of fabrication thereof, wherein a non-conductive adhesive is employed to fasten wafers to the substrate and maintain alignment between compression bonded contacts. While solder-type materials may be used as the contact material, reflow is not required, thus enhancing rework ability. Other contact materials may also be used, for example gold studs.

Kaplan, S. B. Dotsenko, V. Tolpygo, D., "High-Speed Experimental Results for an Adhesive-Bonded Superconducting Multi-Chip Module", IEEE Transactions on Applied Superconductivity, June 2007 (vol. 17(2), Part 1, pages: 971-974), expressly incorporated herein by reference.

According to one aspect of the invention, the chip and substrate for a superconducting multichip module have matched CTEs, e.g., both are silicon wafers, so a thin layer of epoxy is able to effectively bond them, without bowing or delaminating, for example, over a broad range of temperatures, despite a CTE mismatch of the adhesive material itself, particularly if the adhesive is was specially chosen to maintain its strength at cryogenic temperatures. The preferred non-conductive adhesive is an epoxy that has suitable mechanical characteristics at cryogenic temperatures, to reliably bond the wafer to the substrate, when subject to normal operating conditions, which may include cryocooler vibrations, environmental vibrations (e.g., from cryocooler operation, mobile platforms), shocks, thermal cycling (room temperature to cryogenic temperatures) and the like.

The preferred adhesive generally has a low filler concentration, and typically has a coefficient of thermal expansion which does not match that of the wafer or substrate, which themselves typically have matching coefficients, and may be formed of the same material. The preferred adhesive has a relatively low viscosity, and during the multichip module formation process, forms a thin layer between the wafer and substrate. For example, it is preferred that the layer be less than about 100 microns thick. For thin layers, the mismatch of the coefficient of thermal expansion are generally tolerated without bond failure, while thicker layers may be subject to increased stresses and may be more subject to failure. The preferred adhesive layer thickness is between about 10 microns and 70 microns, representing, at the lower extreme, the average height of InSn solder bumps, and at the upper extreme, the height of gold stud contacts.

The uncured adhesive preferably has a low viscosity, e.g., less than about 10,000 cp, preferably less than about 1,000 cp, and more preferably less than about 500 cp, which allows the adhesive to be readily distributed over the bonding area without voids, while being readily squeezed from the intercontact space and not substantially redistributing forces at the respective contacts due to compression of the wafer and substrate during curing, which are intended to be plastically deformed during the process by the application of the pressure. The plastic deformation ensures a relatively high contact area, and permits accommodation for variations in the height of the various contacts, which extend above the surface and are generally placed on the devices during a plating or dipping process, and therefore are subject to statistical variations.

It has been found that a compression cycle between the wafer and substrate in the presence of uncured adhesive leads to a functional module which is tolerant of environmental vibration at room temperature and cryogenic temperatures, yet may under some conditions be intentionally separated and rebonded.

For example, it may be desirable to rework modules in which the active electronics fail, or cannot be fully tested before assembly into a module. This therefore allows an increase in yield.

Certain epoxy bonds may be weakened, for example, by a chemical reaction or solvent which then allows mechanical force to separate the wafer from the substrate, for example, by applying a shear force, or a tensile force. Thus, the adhesive may be selected to be susceptible to degradation to provide a reworkable bond, or resistant to degradation to provide a permanent bond.

This technique has been successfully tested in the fabrication of modules that utilize either In—Sn solder or gold-stud bonds for electrical contact between chip and carrier.

It is noted that, since it is not necessary to raise the temperature of the module to reflow temperatures, heat sensitive electronics may be used, and multiple layers of wafers may be provided to increase package density and decrease average lead distance without risk that relatively later processing steps will disturb earlier formed structures. See, U.S. Pat. No. 6,829,237 (Carson et al.), expressly incorporated herein by reference, which discloses a high speed multi-stage switching network formed from stacked switching layers, possibly including superconducting switch networks on stacked chips.

The technique is not necessarily limited to superconducting circuits, nor is the adhesive limited to epoxy materials. Therefore, a more general application is contemplated. For example, the technique may be used to form MCM's using conventional semiconductors which may cryocooled. Likewise, various reactive or UV or light curable adhesives may be employed, including various epoxies, peroxide, silane/siloxane, or isocyanate adhesives. The cure may be initiated by heat, light or other energy, moisture, or catalyst exposure, for example.

Adhesives provide additional advantages over the soldered contacts within MCM's for the cryogenic case. On removing an MCM from the cryogenic vacuum environment, it is likely (unless special precautions are taken) that water vapor from the air will condense onto the chip. For a soldered MCM, this can lead to corrosion of the contacts and degradation of the solder bonds. In contrast, if the MCM, and especially the interconnecting electrical contacts are hermetically sealed with epoxy, no such entrance of water can take place. While an epoxy overcoat may be used in a reflow bonded MCM, the present technology makes the reflow process unnecessary, and thus permits use of temperature sensitive circuits, and allows use of contract materials which are non-eutectic.

While the epoxy bond is being formed, the metallic bumps are preferably deformed with applied pressure. This helps assure electrical contact if the bumps are non-uniform, and generally provides an increase in contact surface area. As the epoxy cures, it preferably shrinks, maintaining the contacts under compressive strain. As the epoxy is cooled to cryogenic temperatures, it shrinks a bit further (more than the substrate or metallic bump), making the electrical contacts even more secure. Therefore, a preferred adhesive has a small but defined amount of shrinkage upon curing, and has a larger positive coefficient of thermal expansion than the chip and substrate materials, which are, for example, silicon wafers. Preferably, the chip and substrate have the same coefficient of thermal expansion, thus avoiding mismatch and shear forces within or across the adhesive boundary.

It is therefore an object to provide a method for electrically interconnecting two substrates, each having a corresponding set of preformed electrical contacts, comprising providing a liquid curable adhesive over the set of contacts of a first substrate; aligning the set of electrical contacts of the second substrate with the set of electrical contacts of the first substrate; compressing the sets of electrical contacts of the first and second substrate to displace the liquid curable adhesive and provide electrical communication between the respective sets of electrical contacts; and curing the liquid curable adhesive to form a solid matrix which maintains a relative compression between the respective sets of electrical contacts. Electrical conductivity between the respective sets of electrical contacts is preferably maintained over at least a range of temperatures between about +50 C to −175 C.

It is a further object to provide a method for forming a multichip module having at least two electrically interconnected substrates, at least one of the substrates having a deformable metal in a contact region, comprising providing a liquid curable adhesive over the set of contacts of at least a first of the substrates; aligning respective sets of electrical contacts of the first and a second substrate; compressing the sets of electrical contacts of the first and second substrate to deform the deformable metal and exclude liquid curable adhesive from the intercontact zone; and curing the liquid curable adhesive to form a solid matrix while generating a prestress to maintain a compressive force between the respective sets of electrical contacts. The cured adhesive preferably maintains mutual compression and electrical conductivity between the corresponding sets of predefined electrical contacts over at least a range of temperatures between about +50 C to −175 C. A superconducting device on at least one of the electrically interconnected substrates may then be operated at cryogenic temperatures, with high speed, narrow pulse signals reliably communicated to the other substrate.

It is a still further object to provide a module having electrical interconnections along predefined paths between at least two substrates, comprising first and second substrates, each having corresponding sets of predefined electrical contacts; and a cured adhesive surrounding the sets of predefined electrical contacts, generating a compressive force between the first and second substrates, wherein the corresponding sets of predefined electrical contacts are not thermally welded together, and are maintained in relative compression by the cured adhesive surrounding the sets of predefined electrical contacts.

Preferably, the coefficients of thermal expansion of the first and second substrates are matched, and less than the coefficient of thermal expansion of the cured adhesive, to ensure that when cooled, the contacts do not separate.

The liquid curable adhesive may comprise an epoxy adhesive, preferably being substantially unfilled, and preferably having a viscosity at 20 C of less than about 1000 cp. The adhesive preferably maintains its mechanical integrity down to cryogenic temperatures, and preferably has a positive coefficient of thermal expansion, such that if it is cured at elevated temperatures, a compressive prestress is generated after cooling. The coefficient of thermal expansion of the adhesive is preferably greater than that of the substrate, for similar reasons. Likewise, the adhesive preferably has a degree of shrinkage during curing, which will also generate a compressive prestress. The adhesive may be cured, for example, at a temperature of between about 40 C and 100 C.

The compressing preferably imposes a pressure of between about 5-100 gm per contact pair. The compression preferably plastically deforms a metal on each of the set of contacts of at least one of the first and second substrate, and for example may deform metal provided on each of the corresponding contacts. The set of contacts may include at least 20 contacts, and for example, may have 20, 40, 80 or more contacts, in addition to a set of ground contacts which are useful in Josephson junction-containing integrated circuits, and the process for forming the module is designed to ensure that each of the contacts of the respective sets forms a conductive path between the first and second substrate.

DETAILED DESCRIPTION OF THE PREFERRED EMBODIMENTS

Comparative Example

Single-chip modules (SCMs) consisting of 5-mm×5-mm chips bonded to 1-cm×1-cm silicon carriers with Sn—In eutectic solder, using a well-practiced solder-reflow die-attach method. K. E. Yokoyama, G. Akerling, A. D. Smith, and M. Wire, "Robust superconducting die attach process," *IEEE Trans. Appl. Supercond.*, vol. 7, pp. 2631-2634 (June 1997) ("Yokoyama"). Very impressive high-speed data were obtained with these samples. After several thermal cycles, the contact pads were cleaned of an SCM carrier by immersing it in acetone and placing it in an ultrasonic bath. The chip immediately detached from its carrier. Solder was still attached on both the chip and carrier pads. Likewise, using an ultrasonic probe to excite sound waves in another carrier lead to similar results: the chip detached. Therefore, while reflow soldering techniques for fabricating MCM's generally yield acceptable electrical performance, their mechanical performance is inferior.

The 5 mm$^2$ test chip fabricated with HYPRES' (Elmsford, N.Y.) 1-kA/cm$^2$ process (D. Yohannes, S. Sarwana, S. K. Tolpygo, A. Sahu, Y. A. Polyakov, and V. K. Semenov, "Characterization of HYPRES' 4.5 kA/cm$^2$ & 8 kA/cm$^2$ Nb/AlOx/Nb fabrication processes," *IEEE Trans. Appl. Supercond.*, vol. 15, pp. 90-93, June 2005.) and having InSn bumps formed by dipping the chip in a molten solder bath, was placed over, and aligned with corresponding contacts on a 1 cm$^2$ carrier, and the aligned structed heated to a reflow temperature. Each transmitter launches a pulse train onto a 1.642 PTL (passive transmission line), off chip through a bump, back on chip through another bump.

Example

Experimental results for chip-to-chip data communications on a superconducting Multi-Chip-Module (MCM) using a novel fabrication technique are provided. The MCM was produced using a non-conductive adhesive to bond a 5-mm×5-mm test chip to a 1-cm×1-cm carrier. The module demonstrated superior mechanical stability and protection from its environment during thermal cycling. The MCM also retained its electrical properties after multiple thermal cycling from room temperature to 4 K. The superconducting circuitry successfully passed single-flux quanta at rates exceeding 50 Gbps, with error rates lower than $5\times10^{-14}$ at 36 Gbps using 100-micrometer diameter In—Sn solder bumps, and lower than $6\times10^{-14}$ at 57 Gbps using 30-micrometer-diameter solder bumps. Although this was demonstrated with a single chip, passing the signal off the chip to the carrier and back again is equivalent to communication between two chips on a larger carrier. The extension to more than two chips is also evident.

One embodiment of the invention is intended to improve system assembly time and yield by culling known good die and permanently bonding them to the carrier. Accordingly, chips must first be tested on a test carrier, chips must be demounted from the test carrier and remounted on the MCM system carrier, and the adhesive used for initial chip testing must provide a strong bond while enabling rework.

The solder bumps were produced by dunking a carrier into a bath of liquid solder. K. E. Yokoyama, G. Akerling, A. D. Smith, and M. Wire, "Robust superconducting die attach process," *IEEE Trans. Appl. Supercond.*, vol. 7, pp. 2631-2634, June 1997. Other techniques may be used, and thus it is not necessary to raise the chip to reflow temperatures in all embodiments. The chips were then aligned and bonded to the substrate using a Karl Suss model 150 chip bonder. A drop of adhesive was applied to the substrate just before assembly, and thus the drop remained uncured during compression of the contacts. The bumps easily pushed through the adhesive to make excellent electrical contact. After curing, epoxy shrinkage resulted in reliable electrical connection and mechanical stability. Many kinds of bumps can be used with this technique, including solder, gold studs, and polymers.

Solder bump heights were measured with a Veeco model NT1100 profilometer. Several fluxes were tried, but the technique frequently yielded bump height variations of as much as 50% for 5 µm high bumps, thereby reducing yield. Modules produced with gold stud bumps provided by Palomar Technologies produced superior bump uniformity (±1 µm 1σ), and excellent electrical contact.

The adhesive may be a temporary or permanent type. Permanent type adhesives could not be disassembled even after weeks of soaking in solvents and hours of immersion in an ultrasonic bath, while temporary adhesive bonds were readily severed using an ultrasonic bath or probe.

Thermal cycling experiments were conducted for these modules in which the SCM was cycled between 4K and room temperature more than 10 times without any mechanical or electrical failure. These experiments were deliberately carried out on under harsh conditions, in which the SCM was subject to moisture condensation and quick changes in temperature.

The re-workable adhesive method does not result in perfect yields subsequent to the first bonding, due to difficulty in removing adhesive residues. Some chips could, however, be re-bonded.

A preferred permanent non-conductive adhesive is Tra-Bond 2115, which has a relatively low viscocity of 250 cp. Tra-Bond 2151, with a viscocity of 40,000 cp, on the other hand, was too viscous, and it was difficult to squeeze out the adhesive sufficiently to get good electrical contact. The 2115 lacks filler, whereas the 2151 has added alumina and silica filler, which increases the viscocity and also the thermal conductivity. The process requires that a pressure be applied between the wafer and substrate to displace liquid adhesive from the contact region, to provide metal-to-metal contact, and further that the contacts be deformed to provide a large contact area per contact, and to ensure that statistical variations in contact height do not result in open circuits. However, the amount of pressure that may be applied is limited by the fragility of the wafer and substrate, with too high a pressure potentially leading to fracture. Too little pressure would lead to open circuits. It is noted that the adhesive itself redistributes forces, in a manner somewhat related to the viscosity of the uncured adhesive. A higher viscosity or highly filled liquid will tend to have a greater force redistribution, and therefore a highly viscous liquid may prevent reliable electrical connections from being formed. Likewise, higher viscosity adhesives may persist in the region between the respective contact pairs, leading to formation of an insulating film between them and an open circuit or high impedance path. Depending on the filler composition and characteristics, filler particles may also present a barrier to prevent good contact. Therefore, according to one embodiment of the invention, the adhesive has a relatively low filler concentration and is substantially formed of polymeric substances.

As the preferred adhesives cure, small amount of shrinkage occurs. If the adhesive has a larger positive coefficient of thermal expansion than the wafer and substrate materials, then if the structures are heated during curing, and/or operated at reduced temperatures, a prestress will be imparted to the adhesive. Each of these advantageously increases the force placed between the respective pairs of electrical contacts, and therefore tend to maintain good electrical contact.

In order to accelerate curing of the epoxy, it may be heated. Without heating, curing takes about 24 hours at room temperature. Heating to 60 C in the alignment fixture permits effective curing to be achieved in about 2 hours. This heating also decreases the viscosity of the epoxy even further, enabling more effectively elimination of epoxy from between the electrical contacts, assuring absence of an insulating layer.

The top passivating layer for both the chip and the substrate carrier is generally amorphous $SiO_2$. The epoxy needs to wet this layer effectively, and thus the epoxy may be specially selected for this characteristic. Likewise, since it is not intended to maintain a layer between the metallic contacts, the epoxy may be selected to have a low wettability for the metal contacts, especially when compressed during curing.

In the case of a removable adhesive, for example to permit rework or to test wafers before final assembly, various materials may be used to weaken or degrade the epoxy. The preferred method for removing a frangible epoxy is ACF-X remover (Anisotropic Conductive Film), available from Ito America Inc., www.itousa.com, which is also used for flip chip applications. It is also based on epoxy-like polymers. ACF-X causes epoxy to crack so that it can be removed mechanically. This chemical worked on some other epoxies but not on Tra-Bond 2115, which provides a permanent bond.

When using the Tra-Bond 2115 epoxy, a 2 kg force was used for chips with In—Sn bumps. There are ~200 bumps, thus a pressure of about 10 grams per bump was applied. With gold studs, a force of 60 grams per contact was employed.

Figure 1A:
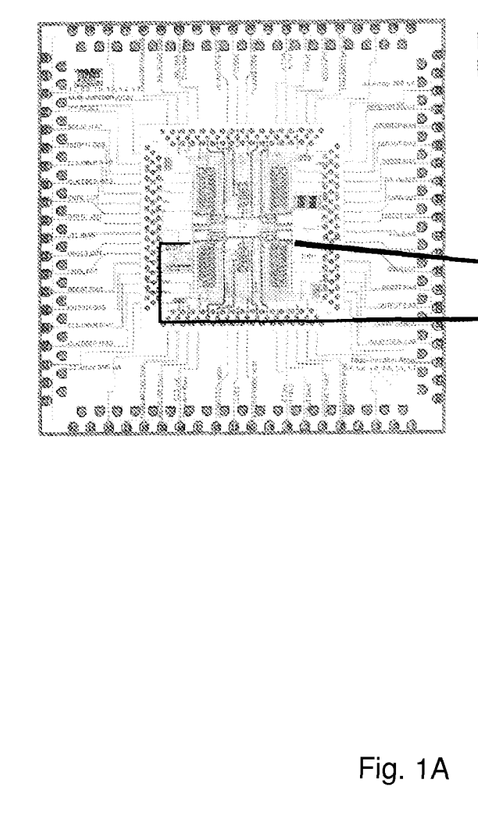
FIG. 1A shows an exemplary substrate wafer in accordance with the present invention, showing the pads for connection to the chip inside the bonding pads for external connection.
Figure 1B:
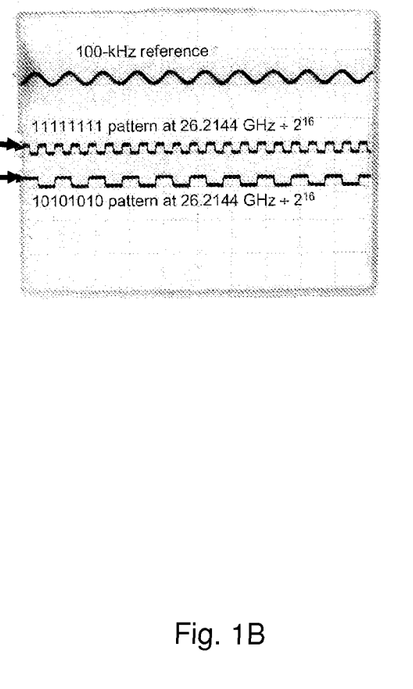
FIG. 1B shows a graph of a reference and data output pattern at 26.2144 GHz.
Figure 1C:
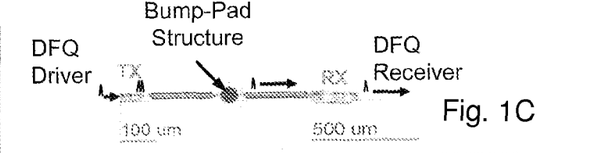
FIG. 1C shows a schematic diagram of the transmission pathway for a signal shown in FIG. 1B.
Figure 1D:
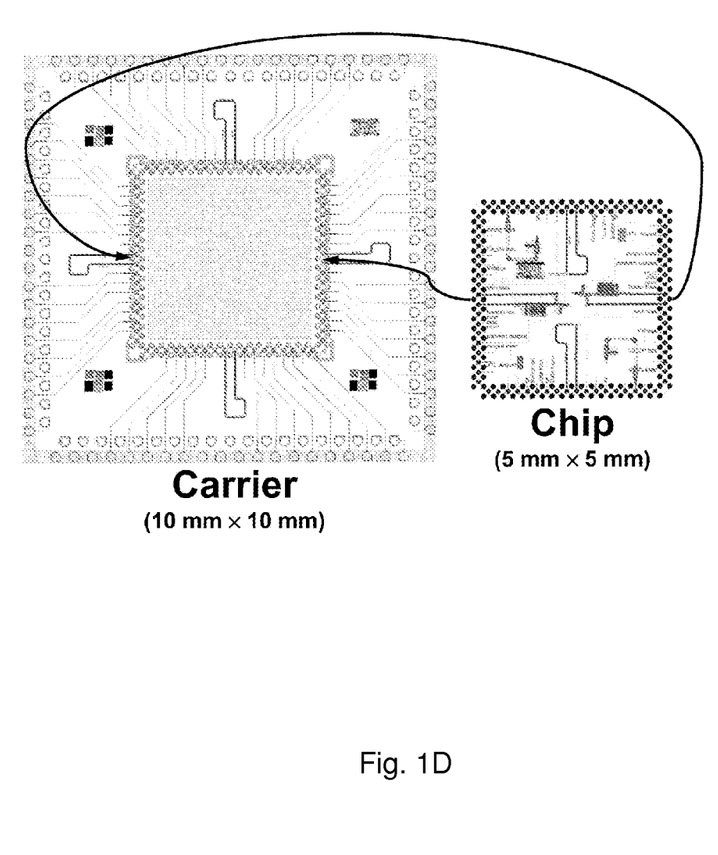
FIG. 1D shows an exemplary chip to be bonded to the wafer of FIG. 1A, showing the pads for connection to the substrate wafer.
Figure 2A:
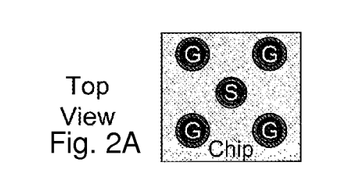
FIGS. 2A, 2B and 2C show, a top view of an exemplary contact pattern of a wafer chip, a side view of the wafer chip and a carrier in position for attachment, and a side view of the bonded wafer chip and carrier, respectively.
Figure 2B:
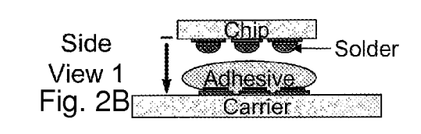
Figure 2C:
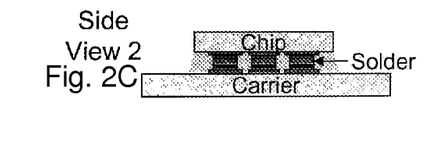
Figure 2D:
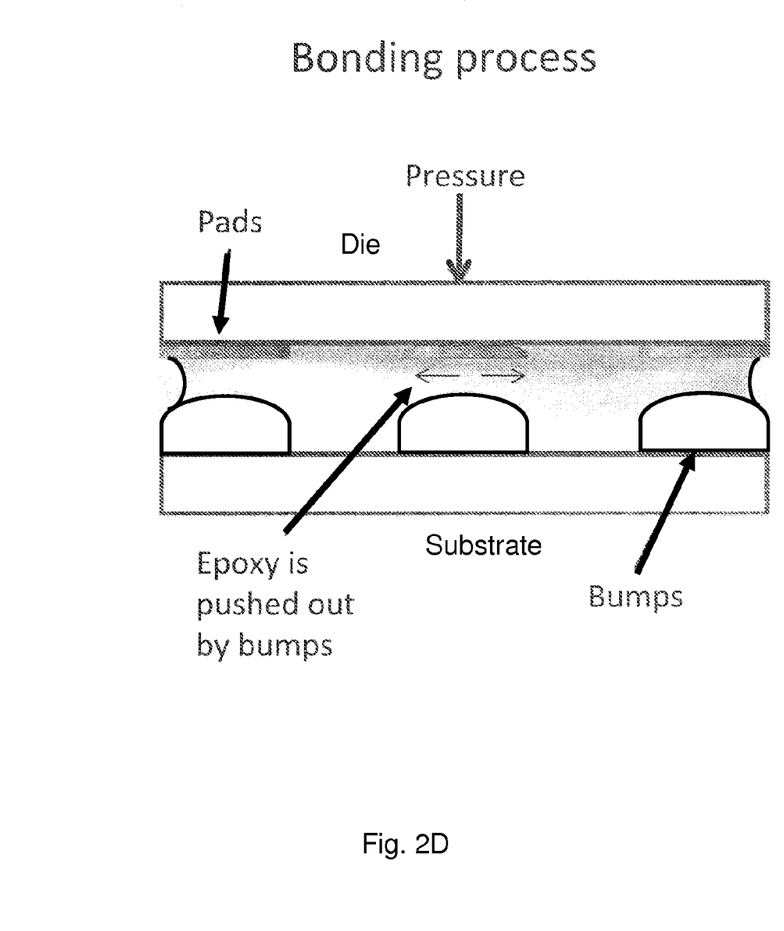
FIG. 2D shows the carrier contacts immersed in liquid adhesive before bonding to the wafer.
Figure 2E:
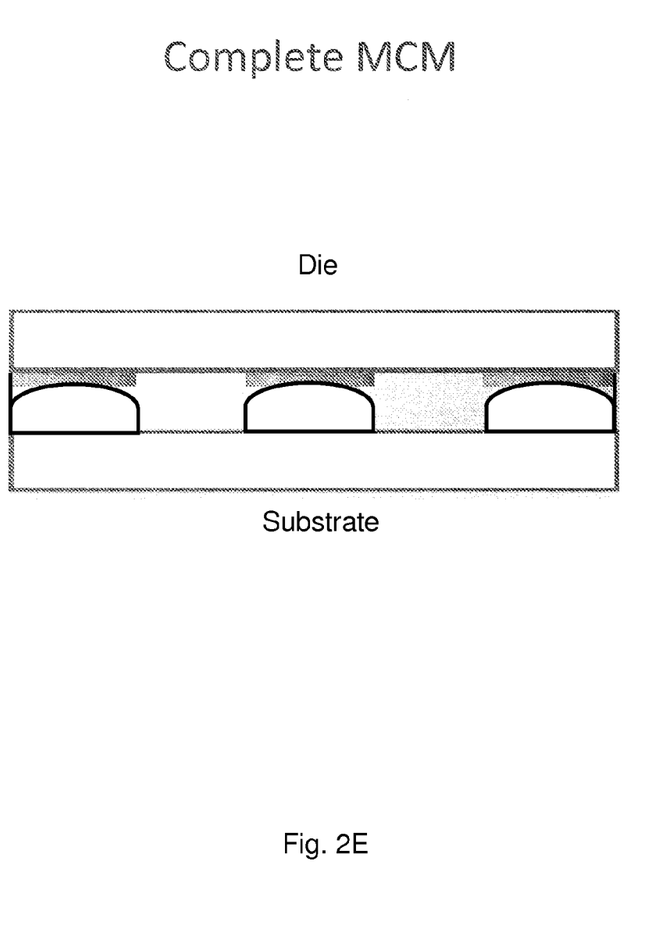
FIG. 2E shows the bonded result, in which the wafer and carrier contacts are compressed to achieve electrical continuity, surrounded by solidified adhesive.

The process for forming the MCM is shown in FIGS. 2A-2E. An array of metallic bumps are first created on the chip contacts. (These bumps can be prepared by prior art methods including In—Sn solder dipping and gold stud bonding.) Then, the chip carrier, shown in FIG. 1E, is coated with a nonconductive adhesive (with relatively low viscosity), the chip, shown in FIGS. 1E and 2A, is carefully aligned with the carrier as shown in FIGS. 2B and 2D, and the two are carefully pressed together in a way that squeezes the glue out of the contact regions and compresses the bumps, without stressing or breaking the chip, as shown in FIGS. 2C and 2E. The assembly may be heated slightly to cure the adhesive, but there is no need to melt the solder. The result is a package that is strongly bonded in the non-contacting regions, and held by compression in the contacts.

The adhesive is specially chosen for these purposes. The final connections must be clean metallic contacts, with very low contact resistance. Any significant insulating residue on the contacts would degrade the signal propagation. Further, the adhesive must be compatible with repeated cycling down between room temperature and cryogenic temperatures without cracking or affecting the contact resistance.

An SFQ racetrack similar to that described in Y. Hashimoto, S. Yorozu, and T. Miyazaki, "Transmission of single flux quantum between superconductor chips," *Appl. Phys. Lett.*, vol. 86, pp. 072502-1-072502-3 (February 2005), was employed to test the performance of the adhesive bonded multichip module. With this technique, one monitors the average voltage while a definite number of flux quanta circumnavigates a loop. This is an excellent method of determining the maximum sustainable data rate in circuits with PTLs and chip-to-chip (C2C) bump connections. A test chip was designed using a target critical current density of 4.5 $kA/cm^2$, and increased the DFQ matching resistor and PTL impedance to 3Ω. The SCMs were assembled with adhesive mechanical bonds.

The racetrack experiment enables a specific number of flux quanta to enter the loop, and to remain circulating while the switch is on. The racetrack speed can be varied by changing the bias of a variable delay line (VDL), which contains a 70-junction Josephson transmission line (JTL). The average voltage is $n\Phi_0/\Delta t$, where $\Delta t$ is the sum of the circuit delay (mostly in the VDL), and the time to pass through the PTL and bump transitions.

The circuit was simulated, and estimated as approximately 340 ps, or 6.1 $\mu V/\Phi_0$ at nominal bias. While the switch is off, there is no observed change in the average voltage. When the switch is turned on, a ramped input voltage is applied to a DC/SFQ converter. As each flux quantum is popped into the loop, the average voltage increases by approximately 6 μV, as expected. (The voltage to be measured is amplified by an Ithaco Model 1201 lownoise preamplifier, Ithaco, Inc. PO Box 6437, Ithaca N.Y. 14851-6437.)

Further increases in the number of flux quanta eventually results in a marked decrease in the step height, indicating a significant increase in the bit error rate (BER). For the adhesive bonded multichip module, the linearity holds up to ~90 μV, corresponding to a data rate of approximately 43 Gbps.

A quantitative estimate of the bit error rate can be obtained by observing how long the average voltage stays on the same voltage step. A voltage of 72 μV could be sustained for more than 10 minutes, indicating that the BER is less than $5 \times 10^{-14}$ at a data rate of 36 Gbps.

Initial results for an experiment using 30 μm solder bumps with signal bumps spaced 80 μm apart and five nearest-neighbor ground bumps show for $n=20\ \Phi_0$ the maximum sustainable voltage was 119 μV, corresponding to a maximum data rate of 57.5 Gbps. The measured BER was less than $6 \times 10^{-14}$ at this data rate.

To increase data rates, bump geometries with more closely spaced 30 μm bumps may be used, for example. The chip-immersion bump-deposition technique often results in unacceptable bump-height variations. Therefore, other bumping methods, such as vacuum-deposited solder bumps, electrographic techniques, and gold stud bumps may be employed, that will assure better uniformity.

Figure 3:
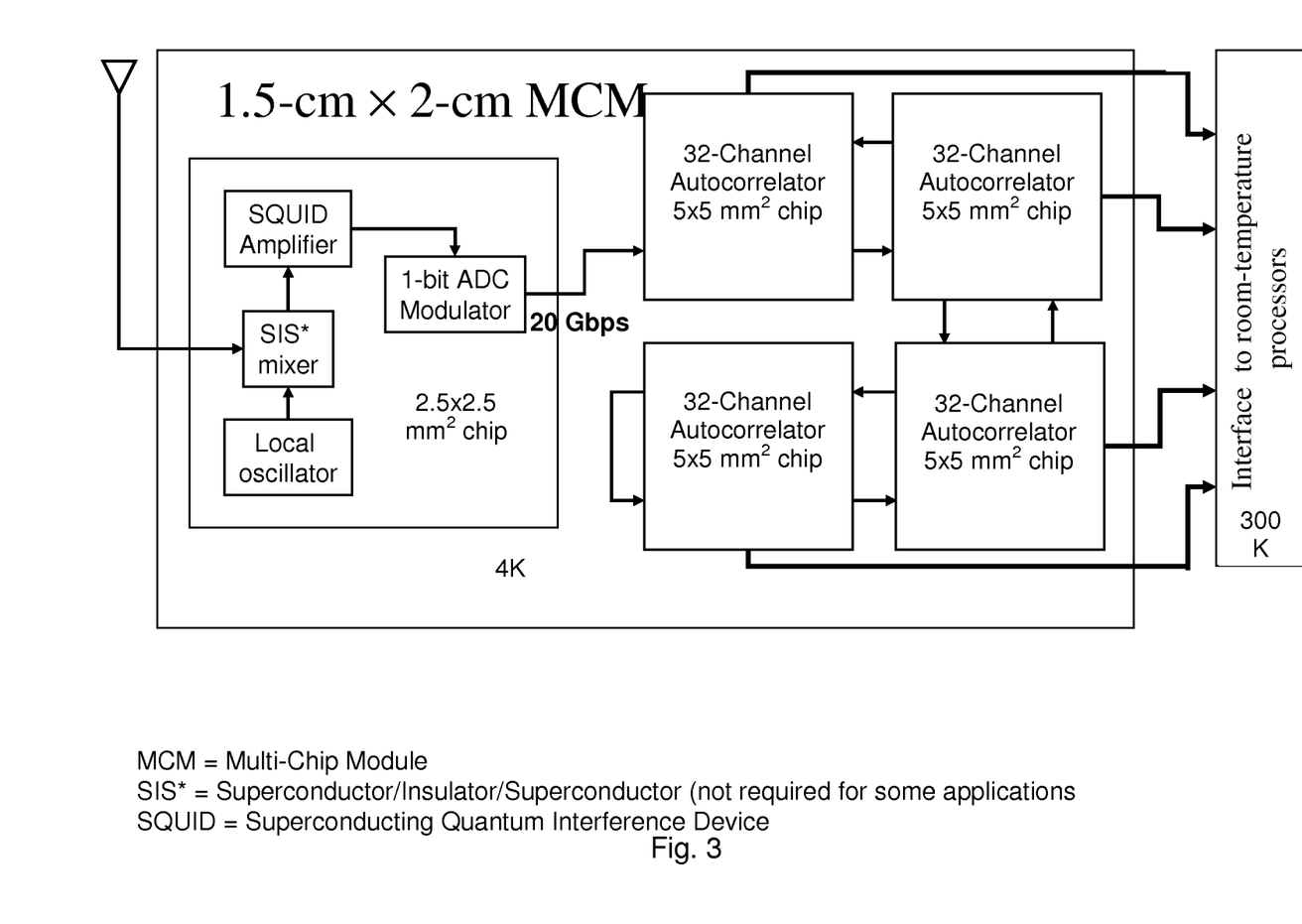
FIG. 3 shows an exemplary multichip module which may be implemented according to the present invention.

The adhesive bonding method for multichip modules may be used, for example, to form a multichip implementation of a digital autocorrelation circuit for a received radio frequency analog signal as shown in FIG. 3. For example, four identical chips, each with a 32-channel digital autocorrelation circuit, together with the front-end ADC chip, are mounted on a substrate for form a multichip module. Each of the devices are provided on a silicon wafer, which, for example, is patterned to provided Josephson junction circuits which are adapted to operate at <10K. All five chips would need to send weak SFQ pulses (~1 mV, 2 ps) between them at a rate of 20 Gbits/s or greater. This embodiment represents a 128-channel digital spectrometer, but since the components are each simpler than an integrated RF-input 128-bit autocorrelator, and the multichip module fabrication technique provides high yield, and in some implementations, a capability for rework, the yield would be much higher than if the entire circuit needed to be on the same chip.

The present invention therefore provides a method for fabricating an MCM by providing a substrate having preformed electrical contacts, placing a liquid curable adhesive over the contacts, placing a chip having corresponding electrical contacts in alignment with the electrical contacts of the substrate to form a liquid curable adhesive-filled gap therebetween, compressing the chip and substrate to displace the liquid curable adhesive between the contacts and form electrical pathways, and curing the liquid curable adhesive to form a solid which maintains the electrical pathways. The present invention further provides an MCM which has a substrate and at least one chip in electrical communication therewith through corresponding sets of predefined electrical contacts, wherein the corresponding sets of predefined electrical contacts are not thermally welded together, and are maintained in relative compression by a cured adhesive surrounding the sets of predefined electrical contacts, which preferably maintains its substantive mechanical characteristics at cryogenic temperatures.

REFERENCES

[1] K. Likharev and V. Semenov, "RSFQ logic/memory family: A new Josephson-junction technology for sub-terahertz-clock frequency digital systems," IEEE Trans. Appl. Supercond., vol. 1, pp. 3-28, March 1991.

[2] D. Gupta, W. Li, S. B. Kaplan, and I. V. Vernik, "High-speed interchip data transmission technology for superconducting multi-chip modules," IEEE Trans. Appl. Supercond., vol. 11, pp. 731-734, June 2001.

[3] J. H. Kang, D. Gupta, and S. B. Kaplan, "Design of RSFQ Digitizer on a Multichip Module", IEEE Trans. Appl. Supercond., vol. 12, pp. 1848-1851, September 2002.

[4] Y. Hashimoto, S. Yorozu, and T. Miyazaki, "Transmission of single flux quantum between superconductor chips," Appl. Phys. Lett., vol. 86, pp. 072502-1-072502-3, February 2005.

[5] K. E. Yokoyama, G. Akerling, A. D. Smith, and M. Wire, "Robust superconducting die attach process," IEEE Trans. Appl. Supercond., vol. 7, pp. 2631-2634, June 1997.

[6] D. Yohannes, S. Sarwana, S. K. Tolpygo, A. Sahu, Y. A. Polyakov, and V. K. Semenov, "Characterization of HYPRES' 4.5 kA/cm$^2$ & 8 kA/cm$^2$ Nb/AlOx/Nb fabrication processes," IEEE Trans. Appl. Supercond., vol. 15, pp. 90-93, June 2005.

[7] S. B. Kaplan, V. Dotsenko, D. Tolpygo, "High-Speed Experimental Results for an Adhesive-Bonded Superconducting Multi-Chip Module", IEEE Transactions on Applied Superconductivity, vol. 17, pp. 971-974, June 2007.

What is claimed is:

1. A module having electrical interconnections along predefined paths between at least two substrates, at least one of the substrates comprising a functional superconducting electronic device, comprising:
first and second substrates, each having corresponding sets of predefined electrical contacts; and
a cured adhesive surrounding the sets of predefined electrical contacts,
wherein the corresponding sets of predefined electrical contacts are not thermally welded together, said cured adhesive comprising a stable solid matrix adhering to the first and second substrates and being configured to maintain mutual compression and electrical conductivity between the corresponding sets of predefined electrical contacts over the entire temperature range from +50 C to −175 C.

2. The module according to claim 1, wherein the cured adhesive comprises an epoxy adhesive.

3. The module according to claim 1, wherein the cured adhesive comprises an adhesive which is configured to maintain its mechanical integrity down to cryogenic temperatures, has a positive coefficient of thermal expansion, and a corresponding uncured adhesive has a viscosity at 20 C of less than about 1000 cp.

4. The module according to claim 1, wherein the cured adhesive is substantially unfilled.

5. The module according to claim 1, wherein the cured adhesive is cured while maintained under a pressure between the first and second substrates of between about 5-100 gm per set of contacts.

6. The module according to claim 1, wherein at least one set of predefined contacts comprises a plastically deformable metal, and wherein a sufficient pressure is applied between the first and second substrates to plastically deform the metal on each of the at least one set of predefined contacts.

7. The module according to claim 1, wherein the sets of contacts comprises at least 20 contacts each, and wherein each of the contacts of the respective sets forms a conductive path between the first and second substrate.

8. The module according to claim 1, wherein the cured adhesive is produced as a result of a curing process during which a corresponding uncured adhesive shrinks to provide a prestress.

9. The module according to claim 1 wherein the first and second substrates have matched coefficients of thermal expansion, and the cured adhesive has a substantially mismatched coefficient of thermal expansion with respect to the first and second substrates.

10. The module according to claim 1, wherein the cure adhesive is removable from the first and second substrates substantially without damage to the at least one of the substrates comprising the functional superconducting electronic device.

11. The module according to claim 1, wherein the functional superconducting electronic circuit comprises a superconducting integrated circuit device.

12. The module according to claim 1, wherein the functional superconducting electronic circuit comprises at least one rapid single flux quantum gate.

13. An electronic module, comprising:
at least one electronic device substrate, each comprising a functional superconducting electronic device, and having an array of predefined electrical contact regions;
an interconnection substrate, having an array of complementary predefined electrical contact regions, wherein elements of the array of predefined electrical contact regions of the at least one electronic device substrate are electrically communicative with elements of the respective array of the complementary predefined electrical contact regions;
a cured liquid adhesive surrounding the set of predefined electrical contact regions and complementary predefined electrical contact regions to hold the set of predefined electrical contact regions and complementary predefined electrical contact regions in alignment;
wherein the set of predefined electrical contact regions and complementary predefined electrical contact regions are maintained in mutual compression as a result of a prestress induced by the cured liquid adhesive and are not thermally welded together, said cured adhesive comprising a stable solid matrix adhering to a respective electronic device substrate and the interconnection substrate, and being configured to and to maintain electrical conductivity between the corresponding sets of predefined electrical contacts over entire temperature range from +50 C to −175 C, wherein at least one of the set of predefined electrical contact regions and the set of complementary predefined electrical contact regions comprises a conductive metal which is deformed by a pressure without melting prior to curing, and which excludes cured liquid adhesive from an intercontact zone between the set of predefined electrical contact regions and the set of complementary predefined electrical contact regions.

14. The electronic module according to claim 13, wherein the cured liquid adhesive is configured to be cured at a temperature of less than about 100 C during curing, in a process having a maximum process temperature less than about 120 C.

15. The electronic module according to claim 13, wherein the cured liquid adhesive comprises an epoxy adhesive which is configured to shrink during curing, and has a positive coefficient of thermal expansion after curing.

16. The electronic module according to claim 15, wherein the interconnection substrate and the electronic device substrate have matched coefficients of thermal expansion, and the cured liquid adhesive has a substantially mismatched coefficient of thermal expansion with respect to the interconnection substrate and the electronic device substrate.

17. The electronic module according to claim 13, wherein the conductive metal which is deformed by a pressure without melting prior to curing is subjected to a compression during curing of between about 5-100 gm per contact pair, to deform the conductive metal.

18. The electronic module according to claim 13, wherein the superconducting electronic device comprises a plurality of rapid single flux quantum gates.

19. The electronic module according to claim 13, wherein the at least one electronic device substrate comprises at least two electronic device substrates, and the interconnection substrate has at least two arrays of complementary predefined electrical contact regions, wherein elements of the array predefined electrical contact regions of a respective electronic device substrate are electrically communicative with elements of the array of the complementary predefined electrical contact regions.

20. The electronic module according to claim 19, wherein the set of predefined electrical contact regions and complementary predefined electrical contact regions are configured for electrical communication of electrical pulses representing bits of a digital signal, having a bit error rate maintained at a level less than $5\times10^{-14}$.

21. The electronic module according to claim 19, wherein:
at least two of the electronic device substrates are configured to electrically communicate through the interconnection substrate,
the cured liquid adhesive is formed by dispensing a cryogenically stable liquid curable adhesive over at least one exposed array of predefined electrical contact regions, in a layer less than about 100 microns thick, and having a viscosity less than about 10,000 cp,
the liquid curable adhesive is distributed over a bonding area encompassing the at least one array of predefined electrical contact regions without voids,
the set of exposed array of predefined electrical contact regions of the interconnection substrate is aligned with the complementary array of predefined electrical contact regions and compressed, the liquid curable adhesive over the array of predefined electrical contact regions being displaced from locations where the exposed sets of contacts of the array of predefined electrical contact regions and the complementary array of predefined electrical contact regions are aligned, to permit electrical communication between the respective aligned array of predefined electrical contact regions and complementary array of predefined electrical contact regions, the liquid curable adhesive being readily squeezed from an intercontact space, substantially without redistributing forces at contact points of respective exposed array of predefined electrical contact regions,
said compressing being sufficient to plastically deform the respective aligned sets of exposed array of predefined electrical contact regions, and
the liquid curable adhesive surrounding the plastically deformed aligned sets of exposed array of predefined electrical contact regions being cured to form a cryogenically stable solid matrix which is configured to maintain a relative compression and electrical conductivity between the respective aligned sets of plastically deformed exposed array of predefined electrical contact regions over entire temperature range from +50 C to −175 C, and
the aligned sets of plastically deformed exposed array of predefined electrical contact regions being aligned, compressed and cured substantially without fusion.

22. The electronic module according to claim 21, wherein the liquid curable adhesive comprises a substantially unfilled epoxy adhesive, which prior to curing has a viscosity at 20 C of less than about 1000 cp, wets silicon dioxide, and subsequent to curing, shrinks, has a positive coefficient of thermal expansion, and maintains its mechanical integrity down to 9 K, wherein the liquid curable adhesive is configured to cure in a process having a maximum process temperature of less than 120 C.

* * * * *